US011217154B2

(12) United States Patent
Jeong et al.

(10) Patent No.: US 11,217,154 B2
(45) Date of Patent: Jan. 4, 2022

(54) PIXEL CIRCUIT AND DISPLAY PANEL

(71) Applicants: SAMSUNG DISPLAY CO., LTD., Yongin-si (KR); KONKUK UNIVERSITY INDUSTRIAL COOPERATION CORP, Seoul (KR)

(72) Inventors: Minjae Jeong, Yongin-si (KR); Keechan Park, Seoul (KR); Joonho Lee, Seongnam-si (KR); Kyunghoon Chung, Yongin-si (KR); Chongchul Chai, Yongin-si (KR)

(73) Assignees: SAMSUNG DISPLAY CO., LTD., Yongin-si (KR); KONKUK UNIVERSITY INDUSTRIAL COOPERATION CORP., Seoul (KR)

( * ) Notice: Subject to any disclaimer, the term of this patent is extended or adjusted under 35 U.S.C. 154(b) by 0 days.

(21) Appl. No.: 17/147,768

(22) Filed: Jan. 13, 2021

(65) Prior Publication Data

US 2021/0312856 A1 Oct. 7, 2021

(30) Foreign Application Priority Data

Apr. 2, 2020 (KR) ........................ 10-2020-0040473

(51) Int. Cl.
*G09G 3/36* (2006.01)
*H03K 3/0233* (2006.01)
*G09G 3/32* (2016.01)

(52) U.S. Cl.
CPC ......... *G09G 3/32* (2013.01); *G09G 2310/027* (2013.01); *G09G 2310/0267* (2013.01);
(Continued)

(58) Field of Classification Search
CPC ............... G09G 3/32; G09G 2310/027; G09G 2330/028; G09G 2310/0291; G09G 2310/0267; G09G 2310/08
See application file for complete search history.

(56) References Cited

U.S. PATENT DOCUMENTS 7,414,599 B2 8/2008 Chung et al.
10,395,590 B1 8/2019 Lin et al.
(Continued)

FOREIGN PATENT DOCUMENTS

KR 10-0560780 3/2006
KR 10-2019-0119693 10/2019
(Continued)

OTHER PUBLICATIONS

Jin-Ho Kim, et al., "PWM Pixel Circuit with LTPS TFTs for Micro-LED Displays", SID 2019 DIGEST, 15-1, pp. 192-195.

*Primary Examiner* — Andrew Sasinowski
(74) *Attorney, Agent, or Firm* — F. Chau & Associates, LLC

(57) ABSTRACT

A display panel includes sub-pixels each including a light-emitting element and a pixel circuit including a first transistor and a second transistor; a timing control unit to generate bias data based on first characteristic information of the first transistor, and generate correction data based on second characteristic information of the second transistor; and a data sensing driving unit configured to receive the bias data and the correction data, and output a bias voltage and a grayscale voltage to the pixel circuit. The pixel circuit includes the first transistor to output a driving current to the light-emitting element; a first driving circuit to control a magnitude of the driving current based on the bias voltage; and a second driving circuit including the second transistor and configured to control a pulse width of the driving current based on the grayscale voltage.

20 Claims, 5 Drawing Sheets

(52) U.S. Cl.
CPC . *G09G 2310/0291* (2013.01); *G09G 2310/08* (2013.01); *G09G 2330/028* (2013.01)

(56) References Cited

U.S. PATENT DOCUMENTS

| | | | | |
|---|---|---|---|---|
| 2007/0045659 | A1* | 3/2007 | Abe ..................... | G09G 3/3696 257/152 |
| 2008/0117234 | A1* | 5/2008 | Yajima ................. | G09G 3/3648 345/690 |
| 2009/0096817 | A1* | 4/2009 | Nishimura ........... | G09G 3/3696 345/690 |
| 2009/0160849 | A1* | 6/2009 | Kiya .................... | G09G 3/3696 345/214 |
| 2016/0104411 | A1* | 4/2016 | Nathan ................ | G09G 3/3241 345/690 |
| 2018/0061307 | A1* | 3/2018 | Inoue .................. | H03F 3/45475 |
| 2019/0318685 | A1 | 10/2019 | Park et al. | |
| 2019/0371231 | A1 | 12/2019 | Kim et al. | |
| 2019/0371232 | A1 | 12/2019 | Kim et al. | |
| 2020/0027388 | A1 | 1/2020 | Iwaki et al. | |

FOREIGN PATENT DOCUMENTS

| | | |
|---|---|---|
| KR | 10-2019-0133695 | 12/2019 |
| KR | 10-2019-0136882 | 12/2019 |
| KR | 10-2019-0137658 | 12/2019 |

* cited by examiner

PIXEL CIRCUIT AND DISPLAY PANEL

CROSS-REFERENCE TO RELATED APPLICATION

This application claims priority under 35 USC § 119 to Korean Patent Application No. 10-2020-0040473, filed on Apr. 2, 2020, in the Korean Intellectual Property Office, the disclosure of which is incorporated by reference herein in its entirety.

FIELD

The present disclosure generally relates to displays, and more particularly relates to a pixel circuit and a display panel with time-division pixel sensing and compensation.

DISCUSSION OF RELATED ART

When emission wavelengths of light-emitting diodes (LEDs), and in particular, micro-LEDs that may use inorganic materials as light-emitting materials and have a micrometer-order magnitude, may change according to the amount of current, it may be difficult to apply a driving method that expresses grayscale based on the amount of current as with organic LEDs.

SUMMARY

According to an exemplary embodiment of the present disclosure, inorganic or micrometer-order light-emitting diodes may be applied as light-emitting elements in a display panel where the pixel circuits are operable using a time-division sensing and driving method.

An embodiment provides a pixel circuit for driving a light-emitting diode. An embodiment provides a display panel including a light-emitting diode.

Additional embodiments may be set forth in part in the description which follows and, in part, may be apparent from the description, or may be learned by practice of the presented embodiments.

A display panel according to an exemplary embodiment includes a plurality of sub-pixels, a timing control unit, and a data sensing driving unit. Each of the plurality of sub-pixels includes a light-emitting element and a pixel circuit configured to output a driving current to the light-emitting element. The pixel circuit includes a first transistor and a second transistor. The timing control unit is configured to generate bias data based on first characteristic information of the first transistor, and generate correction data based on second characteristic information of the second transistor. The data sensing driving unit is configured to receive the bias data and the correction data, and output, to the pixel circuit, a bias voltage corresponding to the bias data and a grayscale voltage corresponding to the correction data.

The pixel circuit may include the first transistor configured to output the driving current to the light-emitting element, wherein the first transistor is connected to the light-emitting element, the first driving circuit configured to control a magnitude of the driving current based on the bias voltage, and a second driving circuit configured to control a pulse width of the driving current based on the grayscale voltage, wherein the second driving circuit includes the second transistor.

A pixel according to an exemplary embodiment includes a pixel circuit connected to a light-emitting element. The pixel circuit includes: a first transistor connected between a first power line and the light-emitting element, the first power line to which a first driving voltage is applied; a fourth transistor including a gate, a first connection end, and a second connection end, the gate being connected to a scan line transmitting a scan signal, the first connection end being connected to a first data line to which a bias voltage is applied, and the second connection end being connected to a gate of the first transistor; a fifth transistor including a gate, a first connection end, and a second connection end, the gate being connected to the scan line, the first connection end being connected to a first sensing line to which a first control voltage is applied, the second connection end being connected to a source of the first transistor; a first capacitor connected between the gate and the source of the first transistor; a second transistor including a gate, a drain, and a source, the drain being connected to the gate of the first transistor, and the source being connected to a second sensing line to which a second control voltage is applied; and a third transistor including a gate, a first connection end, and a second connection end, the gate being connected to the scan line, the first connection end being connected to a second data line to which a grayscale voltage is applied, and the second connection end being connected to the gate of the second transistor.

A display panel according to an exemplary embodiment includes: a light-emitting element; a first transistor connected between a first power line and the light-emitting element, the first power line to which a first driving voltage is applied; a fourth transistor including a gate, a first connection end, and a second connection end, the gate being connected to a scan line transmitting a scan signal, the first connection end being connected to a first data line to which a bias voltage is applied, and the second connection end being connected to a gate of the first transistor; a fifth transistor including a gate, a first connection end, and a second connection end, the gate being connected to the scan line, the first connection end being connected to a first sensing line to which a first control voltage is applied, the second connection end being connected to a source of the first transistor; a first capacitor connected between the gate and the source of the first transistor; a second transistor including a gate, a drain, and a source, the drain being connected to the gate of the first transistor, and the source being connected to a second sensing line to which a second control voltage is applied; a third transistor including a gate, a first connection end, and a second connection end, the gate being connected to the scan line, the first connection end being connected to a second data line to which a grayscale voltage is applied, and the second connection end being connected to the gate of the second transistor; and a second capacitor including a first electrode and a second electrode, the first electrode being connected to a voltage line to which a sweep voltage that changes monotonically during a preset period is applied, and the second electrode being connected to the gate of the second transistor.

A display device according to an exemplary embodiment includes: a plurality of pixels each including a first transistor, a second transistor connected to a gate terminal of the first transistor, and an inorganic or micrometer-order light-emitting element connected to an output terminal of the first transistor; a time-division controller generating bias data based on first characteristic information of the first transistor, and generating correction data based on second characteristic information of the second transistor; and a sensing driver receiving the bias data and the correction data, and providing, to at least one of the plurality of pixels, a bias voltage corresponding to the bias data and a correction voltage corresponding to the correction data.

The display device may include: a first driving circuit connected to the output terminal of the first transistor and controlling a magnitude of a driving current supplied to the light-emitting element based on the bias voltage; and a second driving circuit comprising the second transistor and controlling a pulse width of the driving current based on the correction voltage.

The second driving circuit may include a third transistor and a correction capacitor each connected to a gate terminal of the second transistor, wherein the correction voltage is responsive to the correction capacitor; and the first driving circuit may include a fourth transistor connected to the gate terminal of the first transistor, a fifth transistor connected to the output terminal of the first transistor, and a bias capacitor connected between the gate terminal and the output terminal of the first transistor, wherein the bias voltage is responsive to the bias capacitor.

Other embodiments than those described above may become apparent from the drawings, claims, and/or detailed description of this disclosure.

BRIEF DESCRIPTION OF THE DRAWINGS

The above and other embodiments of the present disclosure will be more apparent from the following description taken in conjunction with the accompanying drawings, in which.

DETAILED DESCRIPTION

Figure 1:
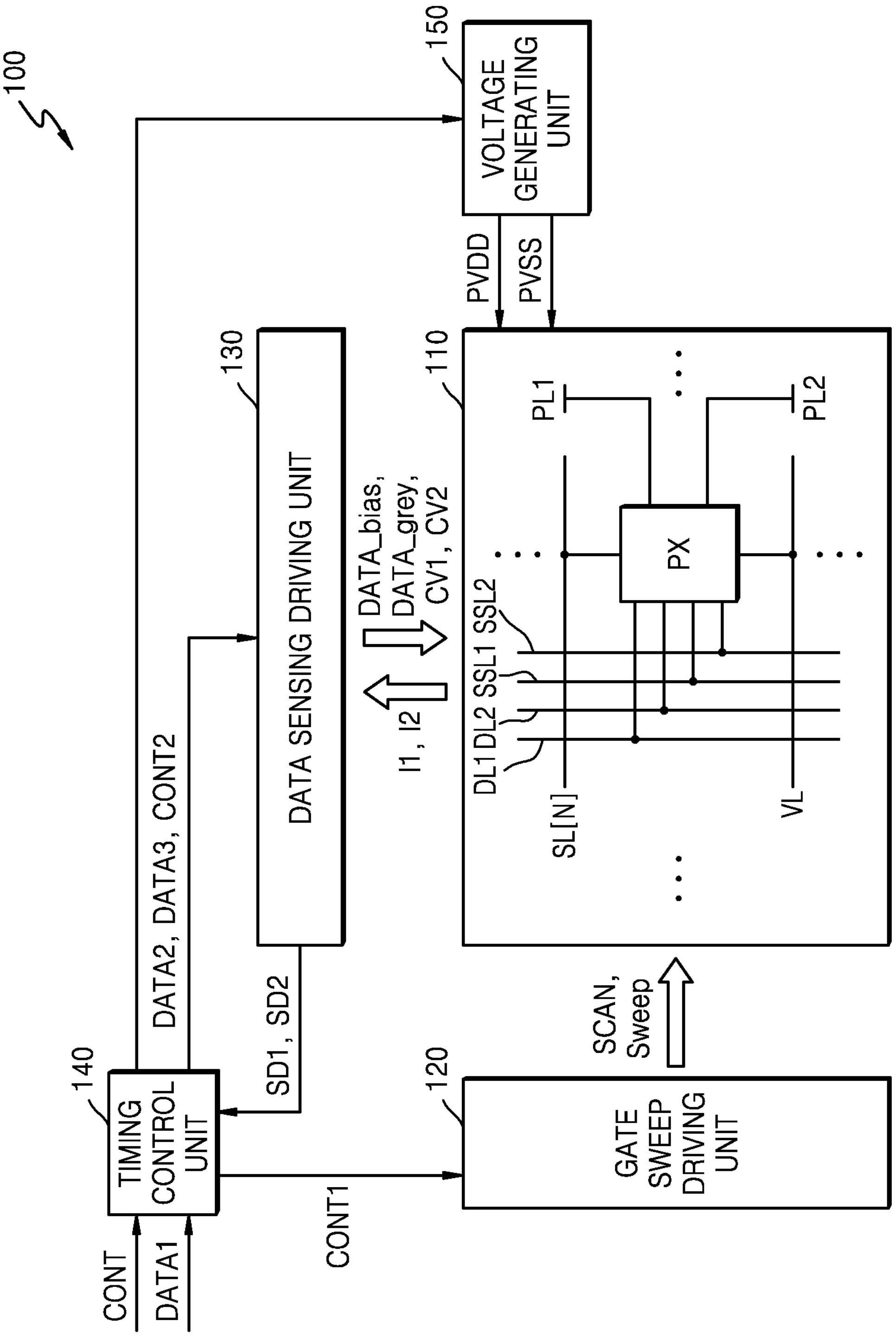
FIG. 1 is a schematic block diagram of a display panel according to an embodiment.

Reference will now be made in detail to embodiments, examples of which are illustrated in the accompanying drawings, wherein like reference numerals may refer to like elements throughout. In this regard, the present embodiments may have different forms and should not be construed as being limited to the descriptions set forth herein. Accordingly, embodiments are described below, with reference to the figures, to explain aspects of the present description by means of example, without limitation thereto. As used herein, the term "and/or" includes any and all combinations of one or more of the associated listed items. Throughout the disclosure, the expression "at least one of a, b or c" may indicate only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. Features, effects, and methods achieving the features and effects will become apparent from the exemplary embodiments described below with reference to the drawings. However, the present disclosure is not limited to the exemplary embodiments described below, and may be implemented in various forms.

Hereinafter, embodiments of the present disclosure will be described in greater detail with reference to the accompanying drawings. To clearly describe the present disclosure, parts irrelevant to the description have been omitted, and in the description with reference to the drawings, the same or like components may be given the same or like reference numerals, where redundant descriptions thereof may be omitted.

While such terms as "first," "second," etc., may be used to describe various elements, such elements must not be limited to the above terms. The above terms are used only to distinguish one element from another. In the following embodiments, an expression used in the singular encompasses the expression of the plural, unless it has a clearly different meaning in the context. When a portion is referred to as being "connected" to another portion, the portion may be directly connected to the other portion, indirectly connected to the other portion, and the portion may also be "electrically connected" to the other portion with an element therebetween. When a portion is referred to as including an element, another element other than the element may be further included, rather than excluding the existence of the other element, unless otherwise described.

Figure 2:
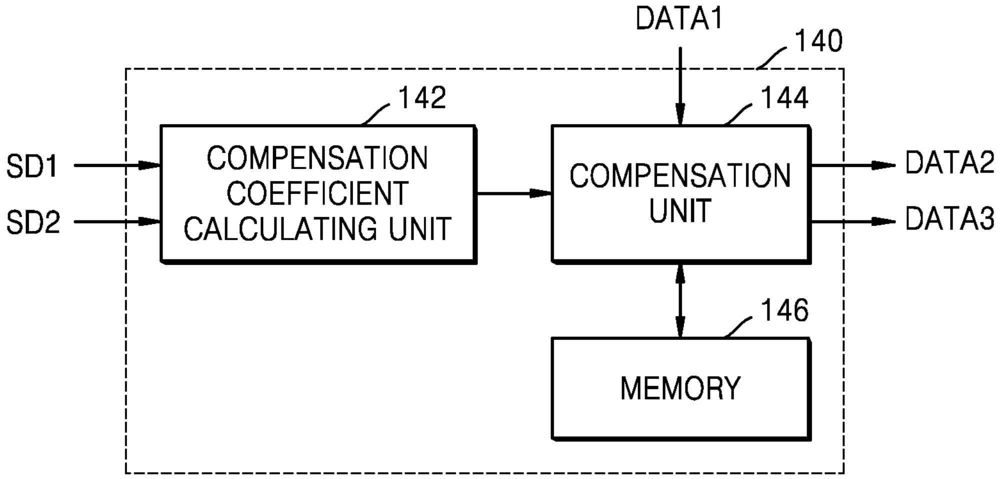
FIG. 2 is a block diagram of a data sensing driving unit according to an embodiment.

FIG. 1 illustrates a display panel 100 according to an embodiment. FIG. 2 illustrates part of a timing control unit 140 of FIG. 1 according to an embodiment.

Referring to FIG. 1, the display panel 100 may include a display unit 110, a gate sweep driving unit 120, a data sensing driving unit 130, a timing control unit 140, and a voltage generating unit 150.

The display unit 110 includes pixels PX. Although only one pixel PX is shown in FIG. 1 for ease of understanding, a plurality of pixels PX may be arranged on the display unit 110. The pixels PX may be arranged in a matrix form including, for example, a plurality of pixel rows extending in a first direction (i.e., a row direction) and a plurality of pixel columns extending in a second direction (i.e., a column direction).

Two or more pixels PX may constitute a unit pixel. The pixel PX shown in FIG. 1 may correspond to a sub-pixel constituting a part of a unit pixel.

The pixels PX of the display unit 110 may be configured to receive an updated bias voltage DATA_bias and an updated grayscale voltage DATA_grey every frame time period, and emit light by a driving current having a magnitude corresponding to the bias voltage DATA_bias and a pulse width corresponding to the grayscale voltage DATA_grey, to thereby display an image corresponding to image data DATA1 of a frame.

Each pixel PX may be connected to a scan line SL[N] and a voltage line VL extending in, for example, the row direction, and may be connected to first and second data lines DL1 and DL2, and first and second sensing lines SSL1 and SSL2 extending in, for example, the column direction. Each pixel PX may be connected to first and second power lines PL1 and PL2.

When the display unit 110 includes the pixels PX arranged in the matrix form, the display unit 110 may include a plurality of scan lines including the scan line SL[N], a plurality of voltage lines including the voltage line VL, a plurality of first data lines including the first data line DL1, a plurality of second data lines including the second data line DL2, a plurality of first sensing lines including the first sensing line SSL1, a plurality of second sensing lines including a second sensing line SSL2, and a plurality of first power lines including the first power line PL1. The display unit 110 may also include a plurality of second power lines PL2 including the second power line PL2.

The scan lines SL[N] and the voltage lines VL may extend in, for example, the row direction and may be connected to the gate sweep driving unit 120. The first data lines DL1, the second data lines DL2, the first sensing lines SSL1, and the second sensing lines SSL2 may extend in, for example, the column direction and may be connected to the data sensing driving unit 130. The first power lines PL1 and the second power lines PL2 may be connected to the voltage generating unit 150.

Hereinafter, the scan line SL[N], the voltage line VL, the first and second data lines DL1 and DL2, the first and second sensing lines SSL1 and SSL2, and the first and second power lines PL1 and PL2, all of which are connected to the pixel PX, may be described in greater detail.

Each pixel PX includes a light-emitting element and a pixel circuit that outputs a driving current to the light-emitting element. The light-emitting element may be an inorganic light emitting diode (LED) manufactured using an inorganic material. The light-emitting element may be a micro-LED having a dimensional magnitude on the order of, for example, 100 micrometer (μm) or less. The light-emitting element may be an LED that emits light of a specific color, such as a red LED, a green LED, and a blue LED.

The pixel circuit includes a plurality of transistors including first and second transistors and first and second capacitors. The pixel circuit may store a bias voltage DATA_bias and a grayscale voltage DATA_grey in response to a scan signal, and may output, to the light-emitting element, a driving current having a magnitude determined based on the bias voltage DATA_bias and a pulse width determined based on the grayscale voltage DATA_grey. The light-emitting element emits light having an intended wavelength and brightness by a driving current having a controlled magnitude and a controlled pulse width during an intended emission duration, such that the grayscale may be accurately expressed.

The pixel circuit includes the first transistor, a first driving circuit, and a second driving circuit including the second transistor. The first transistor is connected to the light-emitting element and outputs a driving current to the light-emitting element. A magnitude of the driving current is determined according to a magnitude of a voltage applied between a gate and a source of the first transistor.

The first driving circuit is configured to control the magnitude of the driving current based on the bias voltage DATA_bias. The first driving circuit may apply a voltage for maintaining substantially constant the magnitude of the driving current based on the bias voltage DATA_bias between the gate and the source of the first transistor.

The second driving circuit includes a second transistor configured to control a pulse width of the driving current based on the grayscale voltage DATA_grey. The second driving circuit may receive the grayscale voltage DATA_grey and a sweep voltage Sweep that changes monotonically, such as but not limited to substantially linearly, during a preset period, and may control an emission duration of the light-emitting element based on the grayscale voltage DATA_grey and the sweep voltage Sweep. The pixel circuit may be described in greater detail below with reference to FIG. 3.

The gate sweep driving unit 120 may generate a plurality of scan signals SCAN and the sweep voltage Sweep based on a first control signal CONT1 provided from the timing control unit 140. The gate sweep driving unit 120 may sequentially generate the scan signals SCAN. The scan signals SCAN generated sequentially may be supplied to the pixels PX via the scan lines SL[N]. The pixel PX may receive the scan signal SCAN via the scan line SL[N].

The gate sweep driving unit 120 may generate a sweep voltage Sweep that changes substantially linearly during a preset period and provide the sweep voltage Sweep to the pixels PX via voltage lines VL. The sweep voltage Sweep may be a voltage having a magnitude that substantially linearly increases or decreases during a preset period, such as an emission period, and a constant magnitude during a period, such as a data writing period, other than the preset period. The pixel PX may receive the sweep voltage Sweep via the voltage line VL.

The data sensing driving unit 130 may generate a bias voltage DATA_bias, a grayscale voltage DATA_grey, and first and second control voltages CV1 and CV2 based on bias data DATA2, correction data DATA3, and a control signal CONT2, which are provided from the timing control unit 140 in a display mode in which the display panel 100 displays an image.

The data sensing driving unit 130 generates a bias voltage DATA_bias by digital-to-analog conversion of the bias data DATA2 based on the second control signal CONT2, amplifies the bias voltage DATA_bias, and outputs the amplified bias data DATA2 to the first data line DL1. The data sensing driving unit 130 generates a grayscale voltage DATA_grey by digital-to-analog conversion of the correction data DATA3 based on the second control signal CONT2, amplifies the grayscale voltage DATA_grey, and outputs the amplified grayscale voltage DATA_grey to the second data line DL2. The data sensing driving unit 130 may generate a second control voltage CV2 based on the second control signal CONT2 in a display mode and output the second control voltage CV2 to the second sensing line SSL2, and may generate a first control voltage CV1 and output the first control voltage CV1 to the first sensing line SSL1. The pixel PX may receive the bias voltage DATA_bias via the first data line DL1, receive the grayscale voltage DATA_grey via the second data line DL2, and receive the first and second control voltages CV1 and CV2 via the first and second sensing lines SSL1 and SSL2, respectively.

The data sensing driving unit 130 may generate a reference bias voltage, a reference grayscale voltage, and a reference source voltage in a sensing mode for sensing characteristics of the first and second transistors in the pixel PX, and generate first and second sensing data SD1 and SD2 by sensing magnitudes of currents output by the first and second transistors via the first and second sensing lines SSL1 and SSL2, respectively. The data sensing driving unit 130 may provide the first and second sensing data SD1 and SD2 to the timing control unit 140.

The data sensing driving unit 130 may include a sensing circuit for generating the first and second sensing data SD1 and SD2. The sensing circuit may include a plurality of switches, and the switches may be controlled based on the second control signal CONT2. The sensing circuit may be described in greater detail below with reference to FIG. 5.

The voltage generating unit 150 generates first and second driving voltages PVDD and PVSS for driving the display panel 100. The first driving voltage PVDD is applied to the first power line PL1, and the second driving voltage PVSS is applied to the second power line PL2. In an emission interval in which the light-emitting element emits light, a voltage level of the first driving voltage PVDD may be higher than a voltage level of the second driving voltage PVSS.

The timing control unit 140 may control the display unit 110 by controlling the gate sweep driving unit 120, the data sensing driving unit 130, and the voltage generating unit 150. The timing control unit 140 may receive a control signal CONT and the image data DATA1 from an external device. The timing control unit 140 may generate first and second control signals CONT1 and CONT2 by using the control signal CONT. The timing control unit 140 may generate bias data DATA2 based on first characteristic information of the first transistor. The timing control unit 140 may generate correction data DATA3 by correcting the image data DATA1 based on second characteristic information of the second transistor.

Referring to FIG. 2, the timing control unit 140 according to an embodiment may include a compensation coefficient calculating unit 142, a compensation unit 144, and a memory 146.

The compensation coefficient calculating unit 142 may receive first and second sensing data SD1 and SD2. The compensation coefficient calculating unit 142 may calculate a first compensation coefficient for compensating for a variation in characteristics of first transistors of the pixel circuits based on the first sensing data SD1. The compensation coefficient calculating unit 142 may calculate a second compensation coefficient for compensating a variation in characteristics of second transistors of the pixel circuits based on the second sensing data SD2. Characteristics of a transistor may include a threshold voltage and/or mobility of the transistor. The first compensation coefficient may be referred to as the first characteristic information of the first transistor, and the second compensation coefficient may be referred to as the second characteristic information of the second transistor. The first characteristic information and the second characteristic information calculated by the compensation coefficient calculating unit 142 may be stored in the memory 146.

The compensation unit 144 may generate bias data DATA2 for compensating for the variation in characteristics of the first transistors based on the first compensation coefficient. The compensation unit 144 may provide the bias data DATA2 to the data sensing driving unit 130.

The compensation unit 144 may receive the image data DATA1. The compensation unit 144 may generate correction data DATA3 by correcting the image data DATA1 based on the second compensation coefficient. The correction data DATA3 is data obtained by correcting the image data DATA1 to compensate for the variation in characteristics of the second transistors. The compensation unit 144 may provide the correction data DATA3 to the data sensing driving unit 130.

Referring back to FIG. 1, the display panel 100 may have a display interval in which an image is displayed and a non-display interval in which an image is not displayed. The display interval may include a plurality of frame time periods. Each frame time period includes a data writing period during which the pixel circuit stores a bias voltage and a grayscale voltage in response to a scan signal, and an emission period during which the light-emitting element may emit light.

The non-display interval includes a first sensing interval for sensing a current output from the first transistor to compensate for the variation in characteristics of the first transistors of the pixel circuits, and a second sensing interval for sensing a current output from the second transistor to compensate for the variation in characteristics of the second transistors of the pixel circuits.

A reference bias voltage and a reference source voltage are applied to the first transistor during the first sensing interval, and the data sensing driving unit 130 may sense a current output from the first transistor while changing a level of the reference bias voltage. A reference grayscale voltage and a reference source voltage are applied to the second transistor during the second sensing interval, and the data sensing driving unit 130 may sense a current output from the second transistor while changing a level of the reference grayscale voltage.

The second sensing interval may be temporally arranged immediately after the first sensing interval. The first sensing interval and the second sensing interval may be temporally arranged immediately after or immediately before the display interval. The first sensing interval and the second sensing interval may exist for each preset period.

First transistors included in the pixels PX preferably have the same characteristics, but may have different characteristics due to process errors, deterioration, etc. When a variation in characteristics of the first transistors is generated, a variation in magnitudes of driving currents output from pixel circuits of the pixels PX to light-emitting elements may be generated. Accordingly, when the variation in magnitudes of the driving currents is generated, the light-emitting elements of the pixels PX may emit light having different levels of brightness, and wavelengths of the emitted light may also be different. According to the present embodiment, the variation in magnitudes of the driving currents caused by the variation in characteristics of the first transistors may be compensated by a bias voltage DATA_bias applied to the pixel PX.

Second transistors included in the pixels PX preferably have the same characteristics, but may have different characteristics due to process errors, deterioration, etc. When a variation in characteristics of the second transistors is generated, pulse widths of the driving currents output from the respective pixel circuits of the pixels PX to the light-emitting elements might not be accurately controlled. When the pulse widths are not accurately controlled, grayscales expressed by the respective pixels PX become inaccurate. According to the present embodiment, the variation in pulse widths of the driving currents caused by the variation in characteristics of the second transistors may be compensated by a grayscale voltage DATA_grey applied to the pixel PX.

Figure 3:
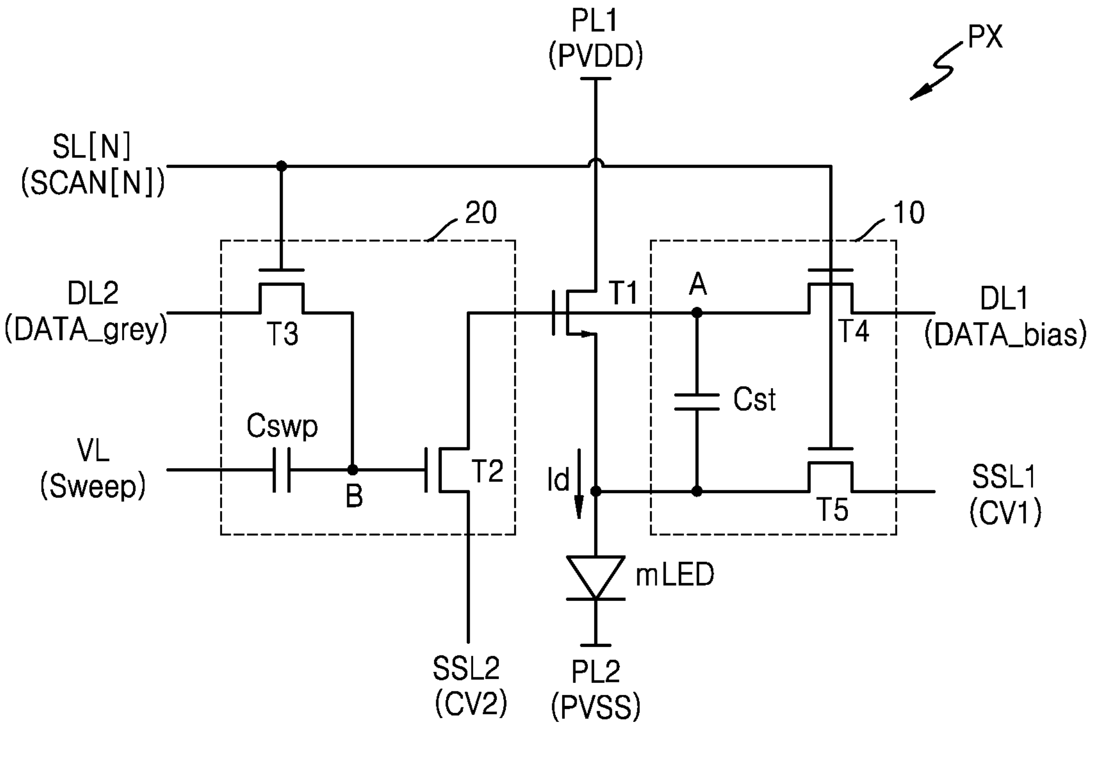
FIG. 3 is a circuit diagram of a pixel according to an embodiment.

FIG. 3 illustrates an exemplary electronic circuit for a pixel PX according to an embodiment.

Referring to FIG. 3, the pixel PX includes a light-emitting element mLED and a pixel circuit that outputs a driving current Id to the light-emitting element mLED. The pixel circuit includes a first transistor T1, a first driving circuit 10, and a second driving circuit 20.

The light-emitting element mLED may be a micro-LED that uses an inorganic material as a light-emitting material and has a micrometer-order dimensional magnitude. As shown in FIG. 3, an anode of the light-emitting element mLED may be connected to a source of the first transistor T1, and a cathode of the light-emitting element mLED may be connected to a second power line PL2 to which a second driving voltage PVSS is applied. As another alternate example, the light-emitting element mLED may be connected between a first power line PL1 to which a first driving voltage PVDD is applied and a drain of the first transistor T1.

The first transistor T1 may be an n-type metal oxide semiconductor field-effect transistor (MOSFET) as shown in FIG. 3. Second, third, fourth, and fifth transistors T2, T3, T4, and T5 may also be n-type MOSFETs. The first to fifth transistors T1 to T5 may be thin-film transistors. Each of the first to fifth transistors T1 to T5 may include a semiconductor material of a metal oxide. For example, each of the first to fifth transistors T1 to T5 may include an active layer formed of a metal oxide.

Hereinafter, an embodiment in which the first to fifth transistors T1 to T5 of the pixel PX are n-type MOSFETs will be described as shown in FIG. 3. However, the first to fifth transistors T1 to T5 of the pixel PX may alternately be p-type MOSFETs, and accordingly, a connection relationship of the pixel circuit may be changed. That is, the spirit of the present disclosure may be similarly applied to a pixel PX including a p-type MOSFET and a display panel including the same.

The first transistor T1 includes a gate connected to a first node A, a drain connected to the first power line PL1 to which the first driving voltage PVDD is applied, and a source connected to the anode of the light-emitting element mLED. The first transistor T1 outputs a driving current Id of which a magnitude is controlled according to a magnitude of a voltage applied to the gate of the first transistor T1.

The first driving circuit 10 includes the fourth transistor T4, the fifth transistor T5, and a first or bias capacitor Cst. The first driving circuit 10 is connected to a scan line SL[N] that transmits a scan signal SCAN[N], a first data line DL1 to which a bias voltage DATA_bias is applied, and a first sensing line SSL1 to which a first control voltage CV1 is applied.

The fourth transistor T4 includes a gate connected to the scan line SL[N], a first connection end connected to the first data line DL1, and a second connection end connected to the first node A and the gate of the first transistor T1. The fourth transistor T4 applies a bias voltage DATA_bias to the gate of the first transistor T1 in response to the scan signal SCAN [N].

The fifth transistor T5 includes a gate connected to the scan line SL[N], a first connection end connected to the first sensing line SSL1, and a second connection end connected to the source of the first transistor T1. The fifth transistor T5 applies a first control voltage CV1 to the source of the first transistor T1 in response to the scan signal SCAN[N].

The first capacitor Cst includes a first electrode connected to the node A and the first gate of the first transistor T1 and a second electrode connected to the source of the first transistor T1. The first capacitor Cst stores a difference between the bias voltage DATA_bias and the first control voltage CV1 transmitted by the fourth transistor T4 and the fifth transistor T5, respectively, in response to the scan signal SCAN[N]. Because the first capacitor Cst is connected between the gate and the source of the first transistor T1, the first transistor T1 outputs, to the light-emitting element mLED, a driving current Id having a magnitude determined based on a voltage stored in the first capacitor Cst.

The bias voltage DATA_bias is a voltage corresponding to bias data DATA2 generated based on characteristics such as a threshold voltage and/or mobility of the first transistor T1, sensed by the data sensing driving unit 130 of FIG. 1. That is, because the bias voltage DATA_bias is a voltage that causes the driving current Id to have a preset magnitude, the driving current Id may have a constant magnitude even if characteristics of the first transistor T1 are irregular due to process errors, deterioration, changes over time, or the like.

The second driving circuit 20 includes the second transistor T2, the third transistor T3, and a second sweep or grayscale correction capacitor Cswp. The second driving circuit 20 is connected to the scan line SL[N] that transmits the scan signal SCAN[N], a second data line DL2 to which a grayscale voltage DATA_grey is applied, a second sensing line SSL2 to which a second control voltage CV2 is applied, and a voltage line VL to which a sweep voltage Sweep is applied, the sweep voltage Sweep changing substantially linearly during a preset period.

The second transistor T2 includes a gate connected to a second node B, a drain connected to the gate of the first transistor T1, and a source connected to the second sensing line SSL2. The second transistor T2 may turn off the first transistor T1 by applying a second control voltage CV2 to the gate of the first transistor T1 according to a voltage applied to the gate of the second transistor T2.

The third transistor T3 includes a gate connected to the scan line SL[N], a first connection end connected to the second data line DL2, and a second connection end connected to the gate of the second transistor T2. The third transistor T3 applies a grayscale voltage DATA_grey to the gate of the second transistor T2 in response to the scan signal SCAN[N].

The second capacitor Cswp includes a first electrode connected to the voltage line VL and a second electrode connected to the gate of the second transistor T2. The second capacitor Cswp may store the grayscale voltage DATA_grey transmitted by the third transistor T3 in response to the scan signal SCAN[N] during a data writing period, and a voltage of the second node B may increase monotonically, such as but not limited to substantially linearly, by the sweep voltage Sweep that changes substantially linearly in an emission period. When the voltage of the second node B rising substantially linearly is higher than a threshold voltage of the second transistor T2, the second transistor T2 may be turned on, and as the second control voltage CV2 is applied to the gate of the first transistor T1, the first transistor T1 may be turned off.

When the grayscale voltage DATA_grey is low, a time point at which the voltage of the second node B is higher than the threshold voltage of the second transistor T2 is delayed, and the first transistor T1 is turned off late, and thus, an emission duration for which the light-emitting element mLED emits light is extended. Conversely, when the grayscale voltage DATA_grey is high, the voltage of the second node B is quickly higher than the threshold voltage of the second transistor T2, and the first transistor T1 is quickly turned off, and thus, the emission duration for which the light-emitting element mLED emits light is shortened. The emission duration for which the light-emitting element mLED emits light is controlled using this method, such that the grayscale may be accurately expressed.

It is preferable that all of threshold voltages of the second transistors T2 of the pixels PX are uniform, but there may be a variation in the threshold voltages of the second transistors T2 due to process errors, deterioration or the like. According to the present embodiment, the grayscale voltage DATA_grey is a voltage corresponding to correction data DATA3 generated by correcting image data DATA1 based on characteristics such as a threshold voltage and/or mobility of the second transistor T2 sensed by the data sensing driving unit 130 of FIG. 1. That is, because the grayscale voltage DATA_grey is a voltage that compensates for a variation in characteristics of each second transistor T2, even if the characteristics of each second transistor T2 are irregular or change over time, the second transistor may be accurately turned off at an intended time by using the sweep voltage Sweep. Therefore, the grayscale may be accurately expressed.

An operation of the pixel PX will now be described with reference to FIG. 4.

Figure 4:
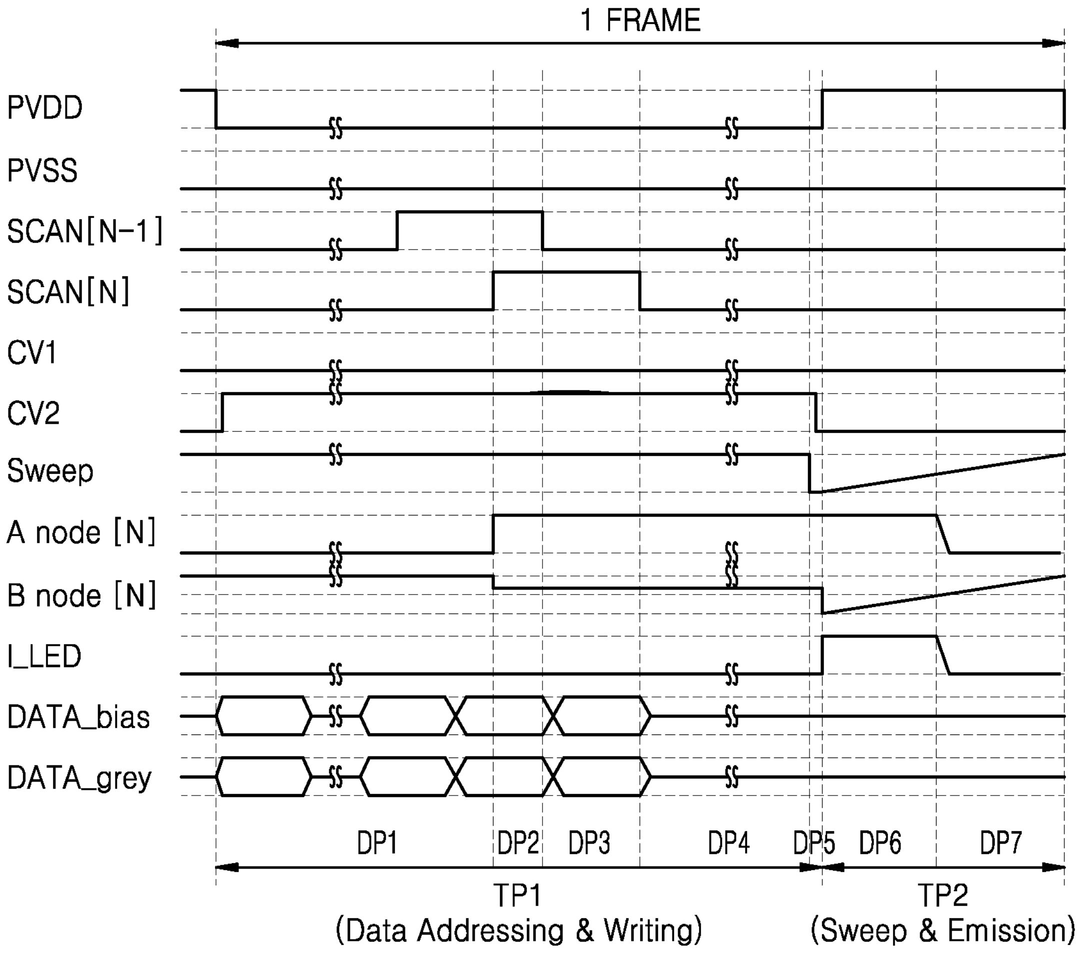
FIG. 4 is a timing diagram during a frame time period for driving the pixel of FIG. 3 in a display mode.

FIG. 4 illustrates signal timing during a frame time period for driving the pixel PX of FIG. 3 in a display mode.

Referring to FIG. 4, the pixel PX may receive new data every frame time period in a display mode in which an image is displayed and may express grayscale corresponding to the received data. One frame time period 1 FRAME may include a data addressing and writing period TP1 and a sweep and emission period TP2.

The data addressing and writing period TP1 is a period during which the pixel PX stores a bias voltage DATA_bias in a first capacitor Cst in response to a scan signal SCAN[N] and stores a grayscale voltage DATA_grey in a second capacitor Cswp. The sweep and emission period TP2 is a period during which the light-emitting element mLED emits light by the driving current Id.

The data addressing and writing period TP1 may be divided into first to fifth periods DP1, DP2, DP3, DP4, and DP5, and the sweep and emission period TP2 may be divided into sixth and seventh periods DP6 and DP7. It may be understood that the first period DP1 is a standby period, the second period DP2 is a pre-charge period, the third period DP3 is a data input period, the fourth period DP4 is a data retention period, and the fifth period DP5 is an emission preparation period. In addition, it may be understood that the sixth period DP6 is a sweep or emission on period, and the seventh period DP7 is a sweep or emission off period.

In the first period DP1, the first driving voltage PVDD may transition to a low level. The first driving voltage PVDD may drop to the same level as the second driving voltage PVSS. In this case, the first driving voltage PVDD may be, for example, −3 V. A voltage level of the source of the first transistor T1 is also substantially lowered to a low level. The first driving voltage PVDD may continue to be at a low level (e.g., −3 V) during the data addressing and writing period TP1.

The second driving voltage PVSS may be at a low level (e.g., −3 V) during one frame time period 1 FRAME. The first control voltage CV1 may also be at a low level (e.g., −3 V) during the one frame time period 1 FRAME.

The second control voltage CV2 may be at a high level (e.g., 2 V) in the first period DP1, and the sweep voltage Sweep may be at a high level (e.g., 6 V) in the first period DP1. The scan signal SCAN[N] may be at a low level, and the third to fifth transistors T3 to T5 may be turned off.

In the second period DP2, the first driving voltage PVDD, the second driving voltage PVSS, and the first control voltage CV1 may be at a low level (e.g., −3 V), the second control voltage CV2 may be at a high level (e.g., 2 V), and the sweep voltage Sweep may be at a high level (e.g., 6 V).

The scan signal SCAN[N] may transition to a high level in the second period DP2, and thus, the third to fifth transistors T3 to T5 may be turned on. In this case, a bias voltage DATA_bias and a grayscale voltage DATA_grey to be written to a pixel PX in a previous row are applied to the first data line DL1 and the second data line DL2. The bias voltage DATA_bias and the grayscale voltage DATA_grey to be written to the pixel PX in the previous row are applied to the first node A and the second node B via the fourth transistor T4 and the third transistor T3, respectively. In this case, as shown in FIG. 4, a voltage of the first node A may increase to a high level and a voltage of the second node B may decrease to an intermediate level.

The bias voltage DATA_bias is about (4+a) V, where a may be a value determined according to the characteristics of the first transistor T1. The grayscale voltage DATA_grey may be a value set according to grayscale data between about −7 V and about 0 V. As a grayscale value of the grayscale data is lower, the grayscale voltage DATA_grey may be at a higher voltage level, and as the grayscale value of the grayscale data is higher, the grayscale voltage DATA_grey may be at a lower voltage level.

In the second period DP2, the first capacitor Cst and the second capacitor Cswp are pre-charged with the bias voltage DATA_bias and the grayscale voltage DATA_grey to be written to the pixel PX in the previous row, such that a length of time in the third period DP3 may be reduced.

A bias voltage DATA_bias (e.g., (4+a) V) to be written to the pixel PX in the previous row is applied to the gate of the first transistor T1, and the first control voltage CV1 having a low level (e.g., −3 V) is applied to the source of the first transistor T1, and thus, the first transistor T1 is turned on. However, because both the first driving voltage PVDD and the second driving voltage PVSS are at a low level, the light-emitting element mLED does not emit light.

The second control voltage CV2 having a high level (e.g., 2 V) is applied to the source of the second transistor T2 and a bias voltage DATA_bias (e.g., (4+a) V) to be written to the pixel PX in the previous row is applied to the drain of the second transistor T2, but a grayscale voltage DATA_grey (e.g., about −7 V to about 0 V) to be written to the pixel PX in the previous row is applied to the gate of the second transistor T2. Accordingly, the second transistor T2 is not turned on.

In the third period DP3, the first driving voltage PVDD, the second driving voltage PVSS, and the first control voltage CV1 may be at a low level (e.g., −3 V), the second control voltage CV2 may be at a high level (e.g., 2 V), and the sweep voltage Sweep may be at a high level (e.g., 6 V). The scan signal SCAN[N] is at a high level, and the third to fifth transistors T3 to T5 are turned on.

A bias voltage DATA_bias and a grayscale voltage DATA_grey to be written to a current pixel PX are received via the first data line DL1 and the second data line DL2. The bias voltage DATA_bias and the grayscale voltage DATA_grey are applied to the first node A and the second node B, that is, the first capacitor Cst and the second capacitor Cswp, respectively.

A bias voltage DATA_bias (e.g., (4+a) V) is applied to the gate of the first transistor T1, and the first control voltage CV1 having a low level (e.g., −3 V) is applied to the source of the first transistor T1, and thus, the first transistor T1 is turned on. However, because both the first driving voltage PVDD and the second driving voltage PVSS are at a low level, the light-emitting element mLED does not emit light.

The second control voltage CV2 having a high level (e.g., 2 V) is applied to the source of the second transistor T2, a bias voltage DATA_bias (e.g., (4+a) V) is applied to the drain of the second transistor T2, but a grayscale voltage DATA_grey (e.g., about −7 V to about 0 V) is applied to the gate of the second transistor T2. Accordingly, the second transistor T2 is not turned on.

In the fourth period DP4, the first driving voltage PVDD, the second driving voltage PVSS, and the first control voltage CV1 may be at a low level (e.g., −3 V), the second control voltage CV2 may be at a high level (e.g., 2 V), and the sweep voltage Sweep may be at a high level (e.g., 6 V). The scan signal SCAN[N] is at a high level, and the third to fifth transistors T3 to T5 are turned on.

The scan signal SCAN[N] may transition to a low level, and the third to fifth transistors T3 to T5 are turned off.

A difference between the bias voltage DATA_bias and the first control voltage CV1 having a low level is stored in the first capacitor Cst, and a difference between the grayscale voltage DATA_grey and the sweep voltage Sweep having a high level is stored in the second capacitor Cswp.

In the fifth period DP5, the first driving voltage PVDD, the second driving voltage PVSS, and the first control voltage CV1 are at a low level (e.g., −3 V).

The second control voltage CV2 and the sweep voltage Sweep may transition to a low level. As shown in FIG. 4, after the sweep voltage Sweep first transitions to a low level, the second control voltage CV2 may transition to a low level.

As the sweep voltage Sweep transitions from a high level (e.g., 6 V) to a low level (e.g., 0 V), a voltage of the second node B is also lowered by 6 V. For example, the voltage of the second node B may be between about −13 V to about −6 V. Even if the second control voltage CV2 transitions to a low level (e.g., −6 V), a voltage of the gate of the second transistor T2, that is, the second node B is not higher than the second control voltage CV2, and thus, the second transistor T2 is turned off.

According to the present embodiment, when a grayscale value of grayscale data input to the pixel PX is 0, a grayscale voltage DATA_grey of 0V+Vth2, where Vth2 is a threshold voltage, may be input to the second data line DL2 in the third period DP3. Here, Vth2 is a threshold voltage of the second transistor T2, and the timing control unit 140 of FIG. 1 may store threshold voltage information of the second transistor T2. A difference between the sweep voltage Sweep having a high level (e.g., 6 V) and the grayscale voltage DATA_grey of 0V+Vth2 is stored across the ends of the second capacitor Cswp. In the fifth period DP5, when the sweep voltage Sweep transitions from a high level (e.g., 6 V) to a low level (e.g., 0 V), the voltage of the second node B becomes −6V+Vth2, and when the second control voltage CV2 transitions to a low level (e.g., 6 V), a voltage of the source of the second transistor T2 becomes −6 V. Because a voltage corresponding to the threshold voltage (Vth2) of the second transistor T2 is applied between the gate and the source of the second transistor T2, the second transistor T2 is turned on and applies the second control voltage CV2 having a low level (e.g., −6 V) to the gate of the first transistor T1. The first transistor T1 is turned off by the second control voltage CV2 having a low level (e.g., −6 V), and thereafter, the light-emitting element mLED does not emit light in the sixth period DP6. Because the grayscale value of the grayscale data input to the pixel PX is 0, the light-emitting element mLED should not emit light.

In the sixth period DP6, the first driving voltage PVDD transitions to a high level (e.g., 5 V). As a voltage difference (e.g., 8 V) is generated between the first power line PL1 and the second power line PL2, a current path is formed, the first transistor T1 outputs a driving current Id corresponding to a voltage stored in the first capacitor Cst, and the light-emitting element mLED emits light at a brightness corresponding to the driving current Id. Because the bias voltage DATA_bias stored in the first capacitor Cst is a voltage that compensates for the characteristics of the first transistor T1, the driving current Id may have a preset magnitude.

The sweep voltage Sweep increases substantially linearly at a low level (e.g., 0 V). Accordingly, the voltage of the second node B, that is, the gate of the second transistor T2, also increases substantially linearly. A difference between the voltage of the second node B and the second control voltage CV2 having a low level (e.g., −6 V), that is, a voltage between the gate and the source of the second transistor T2, gradually increases. When the voltage between the gate and the source of the second transistor T2 becomes higher than the threshold voltage of the second transistor T2, the sixth period DP6 ends, and the seventh period DP7 begins.

In the seventh period DP7, as the voltage between the gate and the source of the second transistor T2 is higher than the threshold voltage of the second transistor T2, the second transistor T2 is turned on. The second transistor T2 being turned on applies the second control voltage CV2 having a low level (e.g., −6 V) to the gate of the first transistor T1, and the first transistor T1 is turned off.

A timing at which the second transistor T2 is turned on is determined according to the grayscale voltage DATA_grey and the threshold voltage of the second transistor T2. Because the grayscale voltage DATA_grey is a voltage that compensates for the characteristics (e.g., the threshold voltage) of the second transistor T2, the timing at which the second transistor T2 is turned on may be accurately controlled, and the grayscale value of the grayscale data input to the pixel PX may be accurately expressed.

Referring back to FIG. 1, the voltage generating unit 150 may apply a first driving voltage PVDD having a low level (e.g., −3 V) to the first power line PL1 in the data addressing and writing period TP1 and may apply a first driving voltage PVDD having a high level (e.g., 5V) to the first power line PL1 in the sweep and emission period TP2.

The gate sweep driving unit 120 may sequentially output scan signals SCAN[N] in the data addressing and writing period TP1. The gate sweep driving unit 120 may output the scan signal SCAN[N] to the scan line SL[N] connected to the pixel PX in the second and third periods DP2 and DP3. The gate sweep driving unit 120 may output a sweep voltage Sweep that increases substantially linearly to the voltage line VL in the sweep and emission period TP2.

The data sensing driving unit 130 may output a second control voltage CV2 having a high level (e.g., 2 V) to the second sensing line SSL2 in the data addressing and writing period TP1 and may output a second control voltage CV2 having a low level (e.g., −6 V) to the second sensing line SSL2 in the sweep and emission period TP2.

Figure 5:
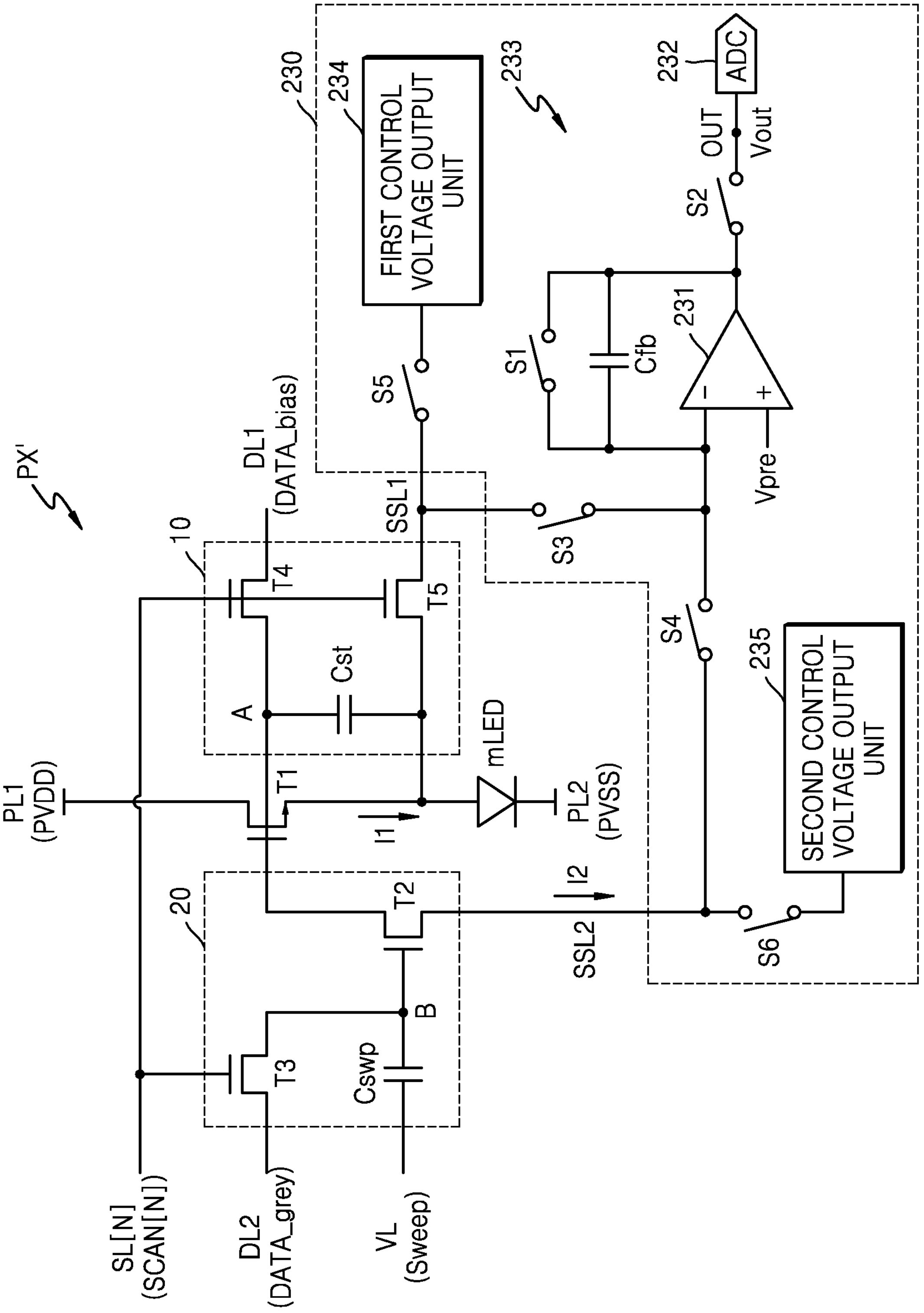
FIG. 5 is a circuit diagram of a pixel and a data sensing circuit connected to the pixel, according to an embodiment.

FIG. 5 illustrates a circuit for a pixel PX' and a data sensing circuit 230 connected to the pixel PX', according to an embodiment.

Referring to FIG. 5, the pixel PX' is similar to the pixel PX shown in FIG. 3, so duplicate description may be omitted.

The data sensing circuit 230 may be included in the data sensing driving unit 130 and is connected to the pixel PX'. The data sensing circuit 230 is connected to the pixel PX' via the first sensing line SSL1 and the second sensing line SSL2. The data sensing circuit 230 is connected to the pixel PX' via the first data line DL1 and the second data line DL2.

The data sensing circuit 230 includes a sensing circuit 233, first and second control voltage output units 234 and 235, and a switch circuit including at least some of a plurality of switches S1, S2, S3, S4, S5, and S6.

The sensing circuit 233 generates first sensing data SD1 (see FIG. 1) by sensing a magnitude of a first current I1 output by the first transistor T1 when a reference bias voltage DATA_bias and a reference source voltage Vpre are applied to the first driving circuit 10, and generates second sensing data SD2 (see FIG. 1) by sensing a magnitude of a second current I2 output by the second transistor T2 when the grayscale voltage DATA_grey and a reference source voltage Vpre are applied to the second driving circuit 20.

The reference bias voltage DATA_bias refers to a voltage input to the first data line DL1 during a first sensing period for sensing the characteristics of the first transistor T1, and the reference grayscale voltage DATA_grey refers to a voltage input to the second data line DL2 during a second sensing period for sensing the characteristics of the second transistor T2. The reference source voltage Vpre refers to a voltage applied to the first or second sensing line SSL1 or SSL2 by the sensing circuit 233. The reference source voltage Vpre may be generated by the data sensing driving unit 130.

The sensing circuit 233 includes an integration circuit and an analog-to-digital conversion circuit 232. The integration circuit includes an operational amplifier 231 and a third capacitor Cfb. The sensing circuit 233 is connected to the first sensing line SSL1 via the third switch S3 and is connected to the second sensing line SSL2 via the fourth switch S4. In the first sensing period, the third switch S3 is closed and the fourth switch S4 is opened. In the second sensing period, the third switch S3 is opened and the fourth switch S4 is closed.

The operational amplifier 231 includes a first input end connected to the third switch S3 and the fourth switch S4, a second input end to which a reference source voltage Vpre is applied, and an output end connected to the analog-to-digital conversion circuit 232. The third capacitor Cfb is connected between the first input end and the output end of the operational amplifier 231. The first switch S1 may be connected to the third capacitor Cfb in parallel.

When the first switch S1 is closed, all of charges stored in the third capacitor Cfb are discharged. When the first switch S1 is opened, a current flowing toward the first input end of the operational amplifier 231 is accumulated in the third capacitor Cfb, and a voltage between both electrodes of the third capacitor Cfb increases in proportion to the accumulated current. A voltage at the output end of the operational amplifier 231 is lowered by the voltage between both electrodes of the third capacitor Cfb. The analog-to-digital conversion circuit 232 may generate sensing data by sensing a voltage Vout of an output node OUT connected to the output end of the operational amplifier 231.

The second switch S2 may be arranged between the output end of the operational amplifier 231 and the output node OUT. The voltage at the output end of the operational amplifier 231 may be sampled in the output node OUT when the second switch S2 is opened, and the analog-to-digital conversion circuit 232 may sense the voltage Vout sampled in the output node OUT.

The first control voltage output unit 234 is connected to the first sensing line SSL1 via the fifth switch S5. The second control voltage output unit 235 is connected to the second sensing line SSL2 via the sixth switch S6. The fifth switch S5 and the sixth switch S6 may each be closed in a display mode and opened in a sensing mode according to the second control signal CONT2 (see FIG. 1).

The data sensing circuit 230 may further include a bias voltage output unit that outputs a bias voltage DATA_bias to the first data line DL1, and a grayscale voltage output unit that outputs a grayscale voltage DATA_grey to the second data line DL2.

Figure 6:
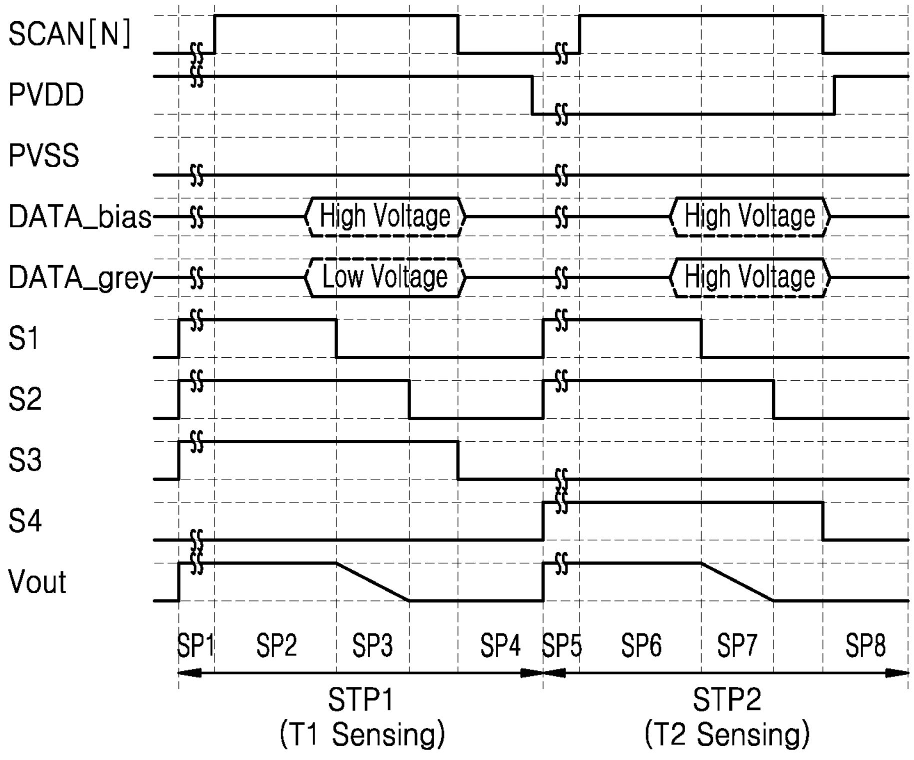
FIG. 6 is a timing diagram for driving the pixel and the data sensing circuit of FIG. 4 in a sensing mode.

FIG. 6 illustrates timing for driving the pixel PX' and the data sensing circuit 230 of FIG. 4 in a sensing mode.

Referring to FIG. 6, the data sensing circuit 230 may sense the characteristics of the first transistor T1 of the pixel PX' in a first sensing period STP1, and the characteristics of the second transistor T2 of the pixel PX' in a second sensing period STP2. The characteristics of the first transistor T1 may be threshold voltage characteristics and/or mobility characteristics, and the characteristics of the second transistor T2 may be threshold voltage characteristics.

The first sensing period STP1 may be divided into first to fourth periods SP1, SP2, SP3, and SP4, and the second sensing period STP2 may be divided into fifth to eighth periods SP5, SP6, SP7, and SP8. The first period SP1 is a standby period, the second period SP2 is a T1 biasing period, the third period SP3 is a first current accumulation period, and the fourth period SP4 is a first sensing period. The fifth period SP5 is a standby period, the sixth period SP6 is a T2 biasing period, the seventh period SP7 is a second current measurement period, and the eighth period SP8 is a second sensing period.

The first driving voltage PVDD may be at a high level in the first sensing period STP1 and may be at a low level in the second sensing period STP2. The second driving voltage PVSS may be at a low level in the first sensing period STP1 and the second sensing period STP2.

A scan signal SCAN[N] is applied to the pixel PX' in the second and third periods SP2 and SP3 of the first sensing period STP1, such that the third to fifth transistors T3 to T5 may be turned on. A scan signal SCAN[N] is applied to the pixel PX' in the sixth and seventh periods SP6 and SP7 of the second sensing period STP2, such that the third to fifth transistors T3 to T5 may be turned on.

In the first period SP1, the first to third switches S1 to S3 are closed, and the fourth switch S4 is opened. A reference source voltage Vpre input to the second input end of the operational amplifier 231 is transmitted to the output end of the operational amplifier 231 using the first switch S1, and an output voltage Vout of the output node OUT becomes equal to the reference source voltage Vpre using the second switch S2.

The third to fifth transistors T3 to T5 are turned on by the scan signal SCAN[N] in the second period SP2 and the third period SP3. A reference bias voltage DATA_bias having a high level is applied to the first data line DL1 in synchronization with the scan signal SCAN[N]. The reference bias voltage DATA_bias is applied to the gate of the first transistor T1 via the fourth transistor T4.

The reference source voltage Vpre is applied to the source of the first transistor T1 via the fifth transistor T5. The first capacitor Cst stores a difference between the reference bias voltage DATA_bias and the reference source voltage Vpre. A difference between the reference source voltage Vpre and the second driving voltage PVSS having a low level may be set smaller than a threshold voltage of the light-emitting element mLED. Because the light-emitting element mLED is not conductible, the first current I1 output from the first transistor T1 does not flow to the light-emitting element mLED.

A grayscale voltage DATA_grey having a low level is applied in synchronization with the scan signal SCAN[N], such that the second transistor T2 may be turned off during the second to fourth periods SP2 to SP4. As another example, because the sweep voltage Sweep is maintained at a low level, the second transistor T2 may be turned off.

The first transistor T1 outputs the first current I1 having a magnitude determined based on the difference between the reference bias voltage DATA_bias and the reference source voltage Vpre. The first current I1 flows through the fifth transistor T5 and the third switch S3 toward the first input end of the operational amplifier 231.

The first switch S1 is closed in the second period SP2, and is opened in the third period SP3. In the second period SP2, the first current I1 flows through the first switch S1 to the output end of the operational amplifier 231. When the first switch S1 is opened in the third period SP3, the first current I1 is accumulated in the third capacitor Cfb. As the first current I1 is accumulated in the third capacitor Cfb, a voltage between both electrodes of the third capacitor Cfb gradually increases.

When the reference source voltage Vpre is biased to a first electrode of a third capacitor Cfb connected to the first input end of the operational amplifier 231, a voltage at the output end of the operational amplifier 231, to which a second electrode of the third capacitor Cfb is connected, is lowered from the reference source voltage Vpre by the voltage between both electrodes of the third capacitor Cfb. As shown in FIG. 3, the voltage Vout of the output node OUT is lowered over time in the third period SP3.

When the third period SP3 ends, the second switch S2 is opened, and the voltage Vout of the output node OUT is no longer lowered. In the fourth period SP4, an analog-to-digital conversion circuit ADC may generate first sensing data SD1 by sensing the voltage Vout of the output node OUT.

The first sensing data SD1 is related to a threshold voltage and/or mobility of the first transistor T1. The data sensing driving unit 130 (see FIG. 1) may generate the first sensing data SD1 while changing the reference bias voltage DATA_bias under the control of the timing control unit 140 (see FIG. 1). The timing control unit 140 may calculate the characteristics of the first transistor T1 based on a magnitude of the reference bias voltage DATA_bias and a value of the first sensing data SD1 and store the characteristics in the memory 146 (see FIG. 2).

In the fifth period SP5, the first to third switches S1 to S3 are closed, and the fourth switch S4 is opened. A reference source voltage Vpre input to the second input end of the operational amplifier 231 is transmitted to the output end of the operational amplifier 231 using the first switch S1, and an output voltage Vout of the output node OUT becomes equal to the reference source voltage Vpre using the second switch S2.

The third to fifth transistors T3 to T5 are turned on by the scan signal SCAN[N] in the sixth period SP6 and the seventh period SP7. In synchronization with the scan signal SCAN[N], a reference grayscale voltage DATA_grey having a high level is applied to the second data line DL2, and a bias voltage DATA_bias having a high level is applied to the first data line DL1.

The bias voltage DATA_bias having a high level is applied to the drain of the second transistor T2 via the fourth transistor T4, and the reference grayscale voltage DATA_grey having a high level is applied to the gate of the second transistor T2 via the third transistor T3. The reference source voltage Vpre is applied to the source of the second transistor T2 via the fourth switch S4.

The second transistor T2 outputs the second current I2 having a magnitude determined based on a difference between the reference grayscale voltage DATA_grey applied to the gate of the second transistor T2 and the reference source voltage Vpre applied to the source of the second transistor T2. The second current I2 flows through the fourth switch S4 toward the first input end of the operational amplifier 231.

The first switch S1 is closed in the sixth period SP6, and is opened in the seventh period SP7. In the sixth period SP6, the second current I2 flows through the first switch S1 to the output end of the operational amplifier 231. When the first switch S1 is opened in the seventh period SP7, the second current I2 is accumulated in the third capacitor Cfb. As the second current I2 is accumulated in the third capacitor Cfb, the voltage between both electrodes of the third capacitor Cfb gradually increases.

When the reference source voltage Vpre is biased to the first electrode of the third capacitor Cfb connected to the first input end of the operational amplifier 231, a voltage at the output end of the operational amplifier 231, to which the second electrode of the third capacitor Cfb is connected, is lowered from the reference source voltage Vpre by the voltage between both electrodes of the third capacitor Cfb. As shown in FIG. 3, the voltage Vout of the output node OUT is lowered over time in the seventh period SP7.

When the seventh period SP7 ends, the second switch S2 is opened, and the voltage Vout of the output node OUT is no longer lowered. In the eighth period SP8, an analog-to-digital conversion circuit ADC may generate second sensing data SD2 by sensing the voltage Vout of the output node OUT.

The second sensing data SD2 is related to a threshold voltage and/or mobility of the second transistor T2. The data sensing driving unit 130 (see FIG. 1) may generate the second sensing data SD2 while changing the reference grayscale voltage DATA_grey under the control of the timing control unit 140 (see FIG. 1). The timing control unit 140 may calculate the characteristics of the second transistor T2 based on a magnitude of the reference grayscale voltage DATA_grey and a value of the second sensing data SD2 and store the characteristics in the memory 146 (see FIG. 2).

According to one or more embodiments, a pixel circuit operating in a time division driving method to drive a light-emitting element such as a micro-LED may be provided. Characteristics of transistors in the pixel circuit may be sensed by a sensing circuit. When a driving circuit outputs a bias voltage and a grayscale voltage that compensate for variations in characteristics of the transistors, a magnitude and a pulse width of a driving current output to the light-emitting element by the pixel circuit are accurately controlled, and thus, the light-emitting element may emit light with accurate brightness and color. Therefore, the display quality of a display panel may be improved.

In addition, when the pixel circuit has a relatively simple structure, high-density pixels may be manufactured, and high yield may be obtained even when manufacturing large-area panels.

It shall be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the pertinent art that various changes in form and details may be made therein without departing from the spirit and scope of the present disclosure as defined by the following claims.

What is claimed is:

1. A display panel comprising:

a plurality of sub-pixels each including a light-emitting element and a pixel circuit configured to output a driving current to the light-emitting element, wherein the pixel circuit includes a first transistor and a second transistor;

a timing control unit configured to generate bias data based on first characteristic information of the first transistor, and generate correction data based on second characteristic information of the second transistor; and a data sensing driving unit configured to receive the bias data and the correction data, and output, to the pixel circuit, a bias voltage corresponding to the bias data and a grayscale voltage corresponding to the correction data, wherein the pixel circuit includes:

the first transistor configured to output the driving current to the light-emitting element, wherein the first transistor is connected to the light-emitting element;

a first driving circuit configured to control a magnitude of the driving current based on the bias voltage; and a second driving circuit configured to control a pulse width of the driving current based on the grayscale voltage, wherein the second driving circuit includes the second transistor.

2. The display panel of claim 1, wherein a variation in magnitudes of the driving currents, generated due to a variation of the first transistors respectively included in the plurality of sub-pixels, is compensated by the bias voltage applied to the first driving circuit, and a variation in pulse widths of the driving currents, generated due to a variation of the second transistors respectively included in the plurality of sub-pixels, is compensated by the grayscale voltage applied to the second driving circuit.

3. The display panel of claim 1, wherein the first transistor is configured to provide, to the light-emitting element, the driving current having a magnitude determined according to a magnitude of a voltage applied between a gate and a source thereof, the first driving circuit is configured to apply a voltage for maintaining substantially constant the magnitude of the driving current based on the bias voltage between the gate and the source of the first transistor, and the second driving circuit is configured to receive a sweep voltage that changes monotonically during a preset period and control an emission duration of the light-emitting element based on the grayscale voltage and the sweep voltage.

4. The display panel of claim 1, wherein the first transistor and the light-emitting element are connected in series between a first power line to which a first driving voltage is applied and a second power line to which a second driving voltage is applied, and the first driving circuit includes:

a fourth transistor configured to apply the bias voltage to a gate of the first transistor in response to a scan signal;

a fifth transistor configured to apply a first control voltage to a source of the first transistor in response to the scan signal; and a first capacitor connected between a gate and the source of the first transistor.

5. The display panel of claim 4, wherein the second driving circuit includes:

the second transistor configured to apply a second control voltage to the gate of the first transistor according to a voltage applied to a gate of the second transistor;

a third transistor configured to apply the grayscale voltage to the gate of the second transistor in response to the scan signal; and a second capacitor of which one end receives a sweep voltage that changes monotonically during a preset period, and the other end is connected to the gate of the second transistor.

6. The display panel of claim 5, wherein the display panel is configured to display an image every frame time period, wherein the frame time period includes i) a data writing period during which the pixel circuit stores the bias voltage in the first capacitor and stores the grayscale voltage in the second capacitor, in response to the scan signal and ii) an emission period during which the light-emitting element emits light for an emission duration corresponding to the pulse width.

7. The display panel of claim 6, further comprising:

a voltage generating unit configured to supply the first driving voltage having a low level to the first power line in the data writing period and supply the first driving voltage having a high level to the first power line in the emission period; and a gate sweep driving unit configured to output the scan signal and supply the sweep voltage that increases substantially linearly in the emission period to the second capacitor, wherein the data sensing driving unit is configured to supply the second control voltage having a high level to the second transistor in the data writing period and supply the second control voltage having a low level to the second transistor in the emission period.

8. The display panel of claim 1, wherein the data sensing driving unit includes a sensing circuit configured to generate first sensing data by sensing a magnitude of a current output from the first transistor when a reference bias voltage and a reference source voltage are applied to the first driving circuit, and generate second sensing data by sensing a magnitude of a current output from the second transistor when a reference grayscale voltage and the reference source voltage are applied to the second driving circuit.

9. The display panel of claim 8, wherein the timing control unit is configured to generate the first characteristic information and the second characteristic information based on the first sensing data and the second sensing data, respectively, and includes a memory storing the first characteristic information and the second characteristic information.

10. The display panel of claim 8, wherein the sensing circuit includes:

a switch circuit configured to selectively apply the reference source voltage to one of the first driving circuit and the second driving circuit;

an integration circuit configured to integrate a received current; and an analog-digital conversion circuit configured to generate the first sensing data and the second sensing data.

11. The display panel of claim 10, wherein the first transistor and the light-emitting element are connected in series between a first power line to which a first driving voltage is applied and a second power line to which a second driving voltage is applied, the first driving circuit includes:

a fourth transistor configured to apply the bias voltage to a gate of the first transistor in response to a scan signal;

a fifth transistor configured to apply a first control voltage to a source of the first transistor in response to the scan signal; and a first capacitor connected between the gate and the source of the first transistor, the second driving circuit includes:

the second transistor configured to apply a second control voltage to the gate of the first transistor according to a voltage applied to a gate of the second transistor;

a third transistor configured to apply the grayscale voltage to the gate of the second transistor in response to the scan signal; and a second capacitor of which one end receives a sweep voltage that changes monotonically during a preset period, and another end is connected to the gate of the second transistor, the switch circuit includes a first switch between the integration circuit and the fifth transistor and a second switch between the integration circuit and the second transistor, and the integration circuit includes an operational amplifier and a third capacitor, the operational amplifier including a first input end to which the first switch and the second switch are connected, a second input end to which the reference source voltage is applied, and an output end connected to the analog-digital conversion circuit, and the third capacitor being connected between the first input end and the output end of the operational amplifier, wherein the data sensing driving unit is configured to:

apply the reference bias voltage to the gate of the first transistor via the fourth transistor, apply the reference source voltage to the source of the first transistor, wherein the first sensing data is generated by receiving a current output from the first transistor via the fifth transistor, apply the reference grayscale voltage to the gate of the second transistor via the third transistor, and apply the reference source voltage to a source of the second transistor, wherein the second sensing data is generated by receiving a current output from the second transistor.

12. A pixel comprising a pixel circuit connected to a light-emitting element, the pixel circuit comprising:

a first transistor connected between a first power line and the light-emitting element, the first power line to which a first driving voltage is applied;

a fourth transistor including a gate, a first connection end, and a second connection end, the gate being connected to a scan line transmitting a scan signal, the first connection end being connected to a first data line to which a bias voltage is applied, and the second connection end being connected to a gate of the first transistor;

a fifth transistor including a gate, a first connection end, and a second connection end, the gate being connected to the scan line, the first connection end being connected to a first sensing line to which a first control voltage is applied, the second connection end being connected to a source of the first transistor;

a first capacitor connected between the gate and the source of the first transistor;

a second transistor including a gate, a drain, and a source, the drain being connected to the gate of the first transistor, and the source being connected to a second sensing line to which a second control voltage is applied;

a third transistor including a gate, a first connection end, and a second connection end, the gate being connected to the scan line, the first connection end being connected to a second data line to which a grayscale voltage is applied, and the second connection end being connected to the gate of the second transistor; and a second capacitor including a first electrode and a second electrode, the first electrode being connected to a voltage line to which a sweep voltage that changes monotonically during a preset period is applied, and the second electrode being connected to the gate of the second transistor.

13. The pixel of claim 12 comprised by a display panel, wherein the display panel is configured to display an image every frame time period including a data writing period and an emission period and further includes:

a gate sweep driving unit configured to output the scan signal to the scan line within the data writing period and output the sweep voltage that increases substantially linearly in the emission period to the voltage line;

a data sensing driving unit configured to output the second control voltage having a high level to the second sensing line in the data writing period, output the second control voltage having a low level to the second sensing line in the emission period, and output the bias voltage and the grayscale voltage to the first data line and the second data line, respectively, in synchronization with the scan signal; and a voltage generating unit configured to output the first driving voltage having a low level to the first power line in the data writing period and output the first driving voltage having a high level to the first power line in the emission period.

14. The pixel of claim 13, the display panel further comprising a timing control unit configured to receive image data, generate bias data based on first characteristic information of the first transistor to provide the bias data to the data sensing driving unit, generate correction data by correcting the image data based on second characteristic information of the second transistor, and provide the correction data to the data sensing driving unit, wherein the data sensing driving unit is configured to receive the bias data and the correction data, generate the bias voltage corresponding to the bias data, and generate the grayscale voltage corresponding to the correction data.

15. The pixel of claim 13, the display panel further comprising:

a first switch connected to the first sensing line;

a second switch connected to the second sensing line;

an operational amplifier including a first input end, a second input end, and an output end, the first input end to which the first switch and the second switch are connected, and the second input end to which a reference source voltage is applied;

a third capacitor connected between the first input end and the output end of the operational amplifier; and an analog-digital conversion circuit connected to the output end of the operational amplifier.

16. The pixel of claim 15, wherein the gate sweep driving unit is configured to output the scan signal to the scan line during a first sensing period for sensing characteristics of the first transistor, and the data sensing driving unit is configured to turn on the first switch and turn off the second switch during the first sensing period, and output a reference bias voltage having a high level and a reference grayscale voltage having a low level to the first data line and the second data line, respectively, in synchronization with the scan signal.

17. The pixel of claim 15, wherein the gate sweep driving unit is configured to output the scan signal to the scan line during a second sensing period for sensing characteristics of the second transistor, and the data sensing driving unit is configured to turn off the first switch and turn on the second switch during the second sensing period, and output a reference bias voltage having a high level and a reference grayscale voltage having a high level to the first data line and the second data line, respectively, in synchronization with the scan signal.

18. A display device comprising:

a plurality of pixels each including a first transistor, a second transistor connected to a gate terminal of the first transistor, and an inorganic or micrometer-order light-emitting element connected to an output terminal of the first transistor;

a time-division controller generating bias data based on first characteristic information of the first transistor, and generating correction data based on second characteristic information of the second transistor; and a sensing driver receiving the bias data and the correction data and providing, to at least one of the plurality of pixels, a bias voltage corresponding to the bias data and a correction voltage corresponding to the correction data.

19. The display device of claim 18, further comprising:

a first driving circuit connected to the output terminal of the first transistor and controlling a magnitude of a driving current supplied to the light-emitting element based on the bias voltage; and a second driving circuit comprising the second transistor and controlling a pulse width of the driving current based on the correction voltage.

20. The display device of claim 19, the second driving circuit comprising a third transistor and a correction capacitor each connected to a gate terminal of the second transistor, wherein the correction voltage is responsive to the correction capacitor; and the first driving circuit comprising a fourth transistor connected to the gate terminal of the first transistor, a fifth transistor connected to the output terminal of the first transistor, and a bias capacitor connected between the gate terminal and the output terminal of the first transistor, wherein the bias voltage is responsive to the bias capacitor.

* * * * *